(12) United States Patent
Said

(10) Patent No.: US 11,297,454 B2
(45) Date of Patent: Apr. 5, 2022

(54) METHOD FOR LIVE PUBLIC ADDRESS, IN A HELMET, TAKING INTO ACCOUNT THE AUDITORY PERCEPTION CHARACTERISTICS OF THE LISTENER

(71) Applicant: AUGMENTED ACOUSTICS, Bonnelles (FR)

(72) Inventor: Laurent Said, Les Mureaux (FR)

(73) Assignee: AUGMENTED ACOUSTICS, Bonnelles (FR)

( * ) Notice: Subject to any disclaimer, the term of this patent is extended or adjusted under 35 U.S.C. 154(b) by 0 days.

(21) Appl. No.: 16/764,577

(22) PCT Filed: Nov. 14, 2018

(86) PCT No.: PCT/FR2018/052838
§ 371 (c)(1),
(2) Date: May 15, 2020

(87) PCT Pub. No.: WO2019/097161
PCT Pub. Date: May 23, 2019

(65) Prior Publication Data
US 2020/0389748 A1 Dec. 10, 2020

(30) Foreign Application Priority Data

Nov. 16, 2017 (FR) ........................ 1771226

(51) Int. Cl.
*H04R 5/02* (2006.01)
*H04S 3/00* (2006.01)
(Continued)

(52) U.S. Cl.
CPC ............ *H04S 3/004* (2013.01); *H03G 7/002* (2013.01); *H04R 27/02* (2013.01); *H04R 2205/041* (2013.01); *H04R 2227/003* (2013.01)

(58) Field of Classification Search
CPC .. H04R 27/00; H04R 27/02; H04R 2205/041; H04R 2227/003; H04S 3/004
(Continued)

(56) References Cited

U.S. PATENT DOCUMENTS

2007/0147629 A1* 6/2007 Chiloyan ............. H04R 1/1033
381/74
2007/0297624 A1* 12/2007 Gilman ................ G10L 19/008
381/119
(Continued)

FOREIGN PATENT DOCUMENTS

WO   WO 2012/066149 A1   5/2012
WO   WO 2016/124865 A1   8/2016
WO   WO 2016/172111 A1   10/2016

OTHER PUBLICATIONS

International Search Report as issued in International Patent Application No. PCT/FR2018/052838, dated Mar. 11, 2019.

*Primary Examiner* — Katherine A Faley
(74) *Attorney, Agent, or Firm* — Pillsbury Winthrop Shaw Pittman LLP

(57) ABSTRACT

A public address method for live broadcast, in a helmet, of an audio signal conditioned from a plurality of raw audio channels, includes a pre-processing phase including the operations that consist of taking into account characteristics of the auditory perception of the listener; correcting each channel as a function of the characteristics of the auditory perception of the listener; a mixing phase including the production, from the channels thus pre-processed, of a mixed audio signal; a post-processing phase including the operations that consist of: measuring the sound level of a background noise; correcting the mixed audio signal as a function of the sound level of the background noise; a phase (Continued)

of reproducing, in the helmet, the conditioned audio signal resulting from post-processing.

15 Claims, 5 Drawing Sheets

(51) Int. Cl.
*H03G 7/00* (2006.01)
*H04R 27/02* (2006.01)

(58) Field of Classification Search
USPC .............................................. 381/57, 82, 106
See application file for complete search history.

(56) References Cited

U.S. PATENT DOCUMENTS

| | | | |
|---|---|---|---|
| 2008/0069385 A1 | 3/2008 | Revit | |
| 2010/0171834 A1* | 7/2010 | Blumenfeld | G06F 3/04842 |
| | | | 348/159 |
| 2014/0050325 A1* | 2/2014 | Norris | H04S 1/002 |
| | | | 381/23 |
| 2017/0017461 A1 | 1/2017 | Tull | |
| 2019/0362735 A1* | 11/2019 | Muench | H04S 3/008 |

* cited by examiner

METHOD FOR LIVE PUBLIC ADDRESS, IN A HELMET, TAKING INTO ACCOUNT THE AUDITORY PERCEPTION CHARACTERISTICS OF THE LISTENER

CROSS-REFERENCE TO RELATED APPLICATIONS

This is the U.S. National Stage of PCT/FR2018/052838, filed Nov. 14, 2018, which in turn claims priority to French Patent Application No. 1771226, filed Nov. 16, 2017, the entire contents of all applications are incorporated herein by reference in their entireties.

The invention relates to the field of public address. More precisely, the invention relates to a public address method and system allowing for live broadcast (i.e. in real time), in the headphones of a listener attending a concert, of a conditioned audio signal from audio channels resulting from a sound pick up of the concert.

"Live" characterises the simultaneity (to the nearest processing time) of the pick up and of the broadcast of the sounds resulting from the concert.

The concert can be the object of a general public address, i.e. the sounds of the show are broadcast for the entire audience by means of speakers.

It is known from international application PCT WO 2016/124865 (Augmented Acoustics) a public address technique of a show that makes it possible to broadcast, in the headphones of a listener attending the spectacle, a signal that restores sounds recorded live, by allowing the listener himself to carry out a mixing of different recorded sound tracks.

This technique substantially improves the sound experience of the listener, because the listener can himself adapt the level of each track according to his preferences. When the headphones are equipped with a background noise reduction system, the sounds resulting from the environment are attenuated in the headphones, which purify the sound perceived by the listener and renders the listening quality close to that which the listener would benefit from in a studio, although the listener is attending a live show.

This technique can be improved further, by making it accessible to persons who suffer from a hearing loss.

In the diagram of FIG. 1 (according to Mercier et al, *The livre des techniques du son*, T.1, Dunod, 3rd ed. 2002, p. 193), the zone in light gray represents the auditory field of a normal human being (i.e. who has perfect auditory perception). The lower limit of the auditory field is the perception threshold. The upper limit thereof is the pain threshold. Superimposed on the auditory field, the musical field ("Music") is shown (in medium gray), i.e. the acoustic field wherein musical instruments usually vibrate. As music instruments were designed to be perceived by the human ear, it is not surprising to observe that the musical field is strictly included in the auditory field. The vocal field ("Voice") is finally shown (in dark gray), i.e. the field wherein the human voice usually vibrates, which it can be seen is strictly included in the musical field.

The diagram of FIG. 1 gives a rough estimation of the human auditory perception. The behaviour of the ear in frequency can be modelled more precisely by isosonic curves, formalised by Fletcher and Munson in the 1930's, then perfected then standardised by the International Standards Organisation in standard ISO 226:2003.

The isosonic curves of the human being represent the intensity for which all the frequencies in the audible range (from 20 Hz to 20 kHz) cause a sensation in level (called loudness) equal to that of the level of a reference sound at 1,000 Hz (Mercier et al, op. cit., p. 195).

FIG. 2 shows the isosonic curves of a normal human being, in increments of 10 dB SPL (SPL: Sound Pressure Level). The isosonic curves are shown in bold, corresponding to:

At the bottom (under the sound pressure level of 10 dB SPL), to the perception threshold, In the middle, to the usual level of comfort (corresponding to a sound pressure level of 50 dB SPL);

At the top, to the pain threshold (sound pressure level of 120 dB SPL).

From the point of view of the afflicted person, the hearing loss is subjective and is difficult to quantify, the person simply hears badly (or not as well).

However it is possible to measure the hearing loss, and this in different ways.

Thus, FIG. 1 shows as a dotted line the limit of the auditory field of a person suffering from a hearing loss: it can be seen that the auditory field thus reduced does not completely encompass the musical field or the vocal field.

Figure 1:
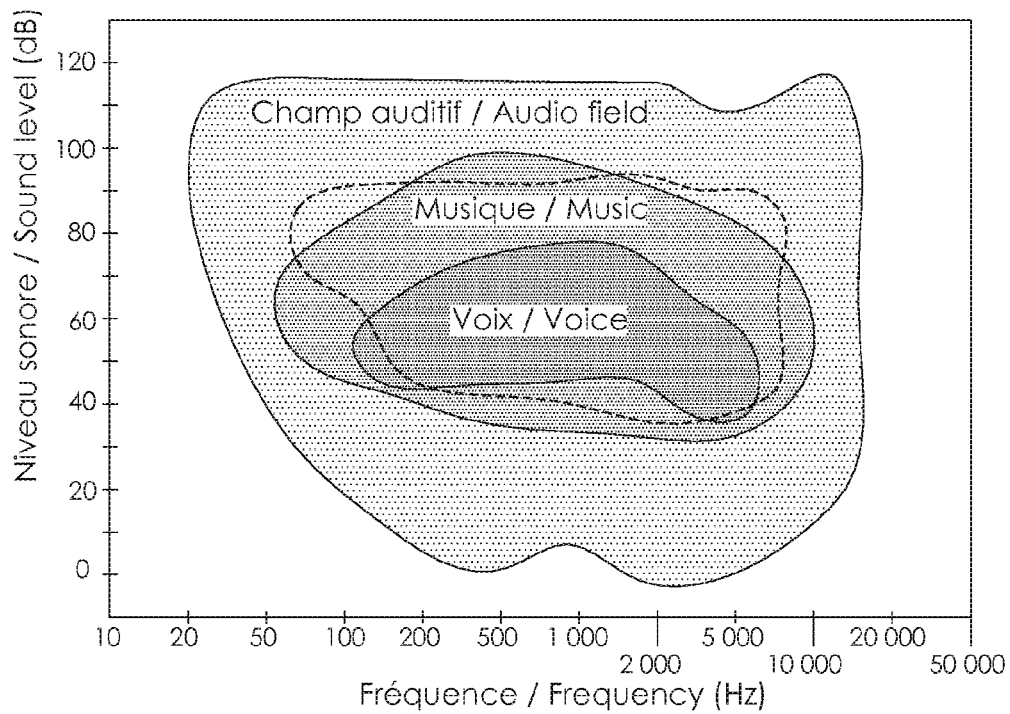

More precisely, it can be seen that the pain threshold is lowered in the low frequencies, while the perception threshold is raised in the high frequencies. In other terms, for the ear considered in FIG. 4, the low-pitched sounds and of a high level are painful, while high-pitched sounds and of a low level are not perceived.

In general, a person afflicted with a hearing loss suffers above all from the consequences of an incorrect perception of voice, which results in a decrease in social interactions and, in fine, a certain withdrawing into oneself.

That is why hearing aid specialists have substantially focused on processing voice, neglecting the processing of music, perhaps considering (wrongly) that this is a luxury reserved for a patient pool that is too restricted or (correctly) that processing music is more complex due to the greater amplitude—and the greater richness—of the musical field.

Yet many music lovers who listened to their music with a headphones at an excessively high level in the 1970's to the 1990's (before sound level limiters were introduced) are today afflicted with moderate to severe hearing loss. It is estimated that 20% of the population is affected.

However, although hearing aids are effective for rendering voice audible (substantially by amplification of the signal at the frequencies concerned), they do not in any way make it possible to restore music in a satisfactory manner.

It moreover is not sufficient to carry out a few adaptations to hearing aids in order to make them able to process music, for example by increasing the frequency range processed.

Indeed, as indicated by Mercier and al (op. cit. p. 50), the ear does not react in the same way to variations in intensity in the low pitch, medium pitch and high pitch. Yet sounds from instruments are for the most part rich in harmonics. The dynamic variation of a sound, for example a crescendo, is not a simple enlarging of the sound such as is frequently carried out in synthesis, but corresponds to an enriching of the spectrum in a sensitive zone of the ear around 3,000 Hz.

It would be wrong to think that it would be sufficient to have recourse to physiological correctors that are well-known to manufacturers of high-fidelity (hi-fi) systems, which amplify the low-pitched and high-pitched components of the spectrum in order to offset the dips of the isosonic curves, because these physiological correctors are intended to improve the listening comfort of normal people, not the hard of hearing, for whom it has been shown that the isosonic curves are very different.

In fact, the worst situation for the hard of hearing is a concert, of which they cannot control the sound pressure other than by adjusting the hearing aid sound level. This is to the extent today that listening to live music is so to speak prohibited for the hard of hearing.

The invention aims to overcome this, by allowing persons suffering from hearing loss to retrieve listening comfort when listening to music broadcast live.

For this purpose, a public address method for live broadcast is proposed, in at least one speaker equipping headphones worn or intended to be worn by a listener, of an audio signal conditioned from a plurality of raw audio channels, this method comprising:
  A pre-processing phase comprising the operations that consist of:
    Taking into account characteristics of the auditory perception of the listener;
    Correcting each channel as a function of the characteristics of the auditory perception of the listener;
  A mixing phase comprising the production, from the channels thus pre-processed, of a mixed audio signal;
  A post-processing phase comprising the operations that consist of:
    Measuring the sound level of a background noise penetrating into the headphones;
    Correcting the mixed audio signal as a function of the sound level of the background noise;
      A phase of reproducing, in the headphones, of the conditioned audio signal resulting from the post-processing.

The audio signal thus restored is adapted to the psycho-acoustic qualities of the listener, and in particular to any hearing losses. This is therefore a customised signal, able not only to render audible domains in the spectrum that would not be audible as open listening, but also to improve the listening comfort.

The correction applied to each channel comprises for example a frequency correction and/or a time correction and/or a level correction.

In practice, the correction applied to each channel can include one or more processings chosen from a clipping, a compression, a gain.

Moreover, the pre-processing phase can comprise the operations that consist of:
  Sampling each channel in frequency,
  Selecting on the channel one or more frequency ranges;
  Applying to the channel a processing in the selected frequency range or ranges, as a function of the characteristics of the auditory perception of the listener in this frequency range or ranges.

In the pre-processing phase, taking into account characteristics of the auditory perception of the listener comprises for example taking into account or determining an auditory comfort level.

Thus, in the pre-processing phase, the correcting of each channel then consists of bringing it substantially to the auditory comfort level of the listener.

Furthermore, between the pre-processing phase and the mixing phase, a panoramic processing operation can be provided in order to form, from each pre-processed channel, a left track and a right track.

Between the panoramic processing and the mixing phase, an amplification operation can also be provided of the left tracks and of the right tracks resulting from each channel.

The mixing phase is advantageously conducted independently for the left tracks and for the right tracks, in such a way as to produce a left mixed audio signal and a right mixed audio signal.

The post-processing phase is then applied to the left mixed audio signal and to the right mixed audio signal in order to produce a left conditioned audio signal and a right conditioned audio signal.

In the post-processing phase, the measurement of the sound level of the noise surrounding the headphones can be carried out by means of a mike integrated into the headphones.

Preferably, in the post-processing phase:
  A pain threshold for the listener is taken into account or determined;
  The mixed audio signal is corrected in such a way that the global sound level in the headphones, comprising the mixed audio signal and the background noise penetrating into the headphones, is at any instant less than the pain threshold of the listener.

Finally, the post-processing phase comprises preferably the application of a delay to the mixed audio signal in order to readjust it on the background noise measured, prior to the correction thereof.

Figure 2:
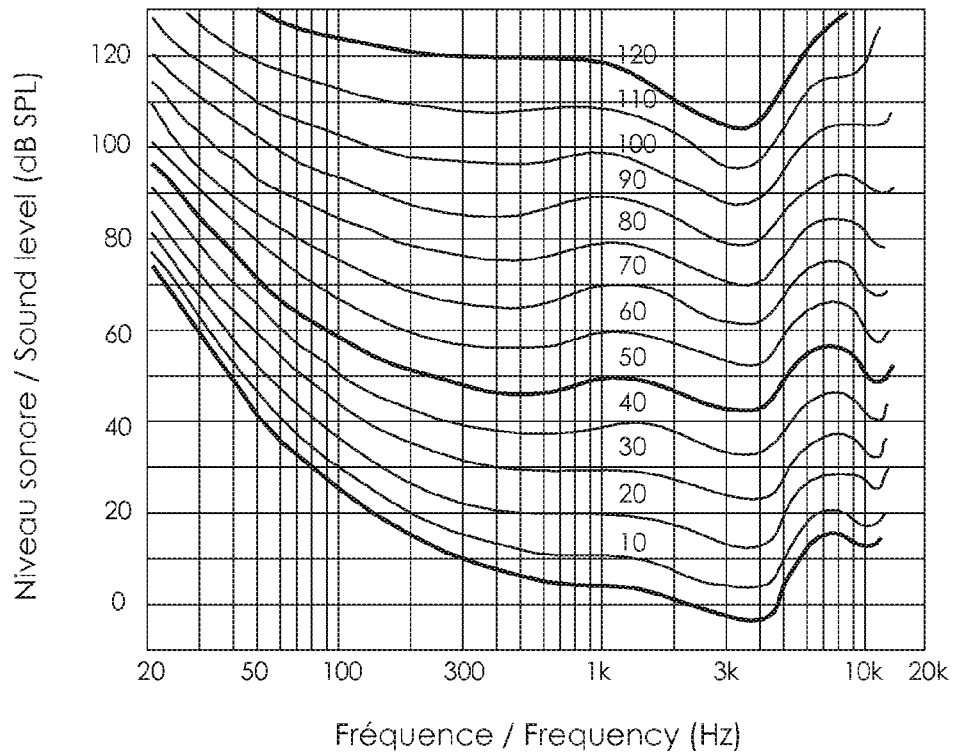
Figure 3:
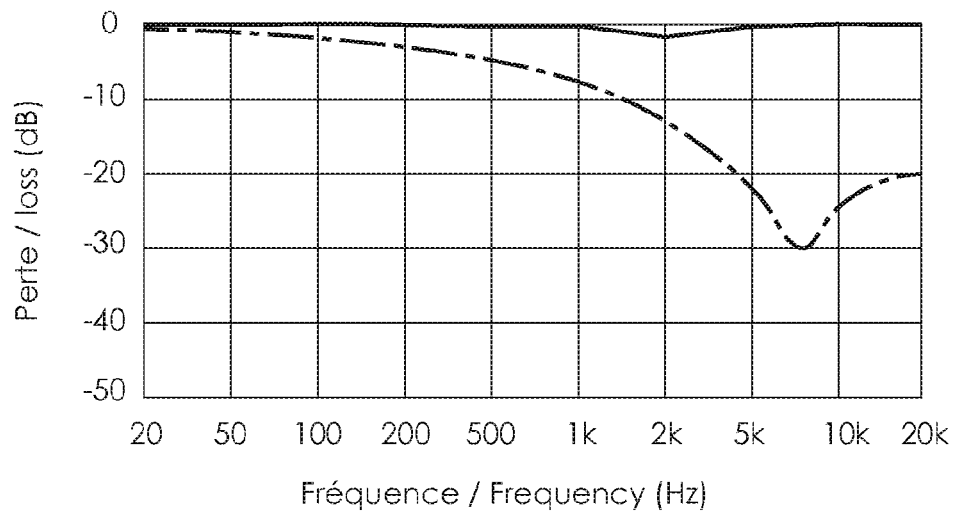
FIG. 3 shows the average hearing loss, for the entire auditory spectrum (20 Hz-20 kHz), of a person 50 years of age (curve with mixed line) in comparison with the audition (curve as a solid line) of a normal person 20 years of age. (This curve, which is provided solely as an example, shows the phenomenon of presbyacusis, i.e. of the loss of hearing due to age.)
Figure 4:
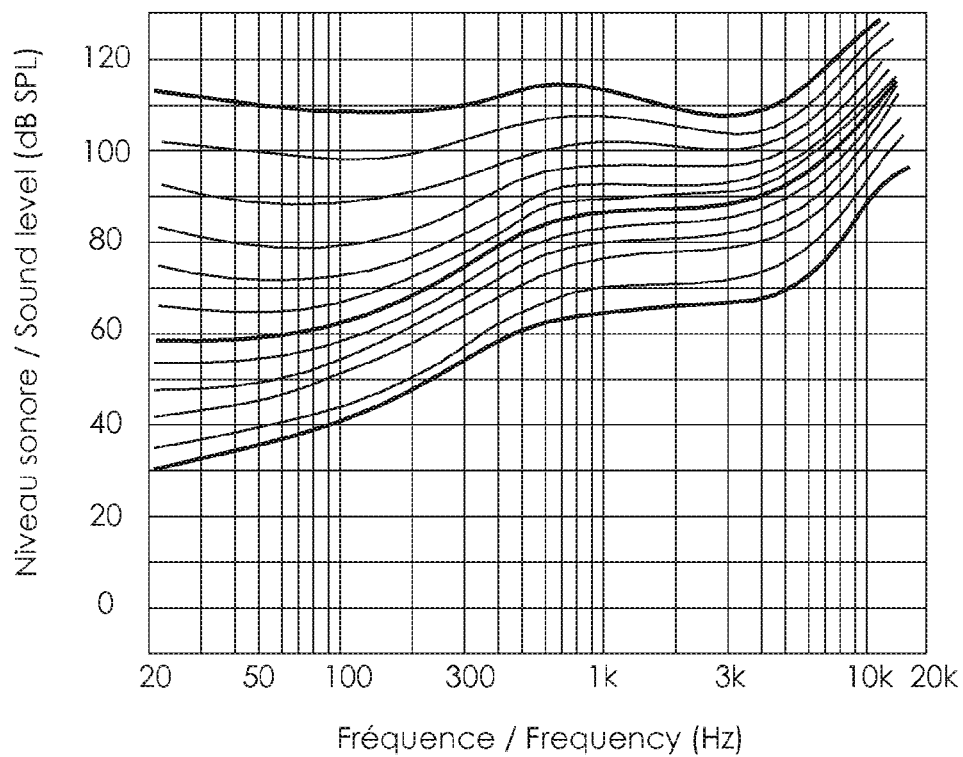
FIG. 4 shows the isosonic curves of a person afflicted with a hearing loss. This representation, more precise than that of FIG. 1 and FIG. 3, not only shows the narrowing of the auditory field of the person concerned: it also provides information on the perception threshold and on the pain threshold, of which it can be seen that they are substantially affected in the case shown.
Figure 5:
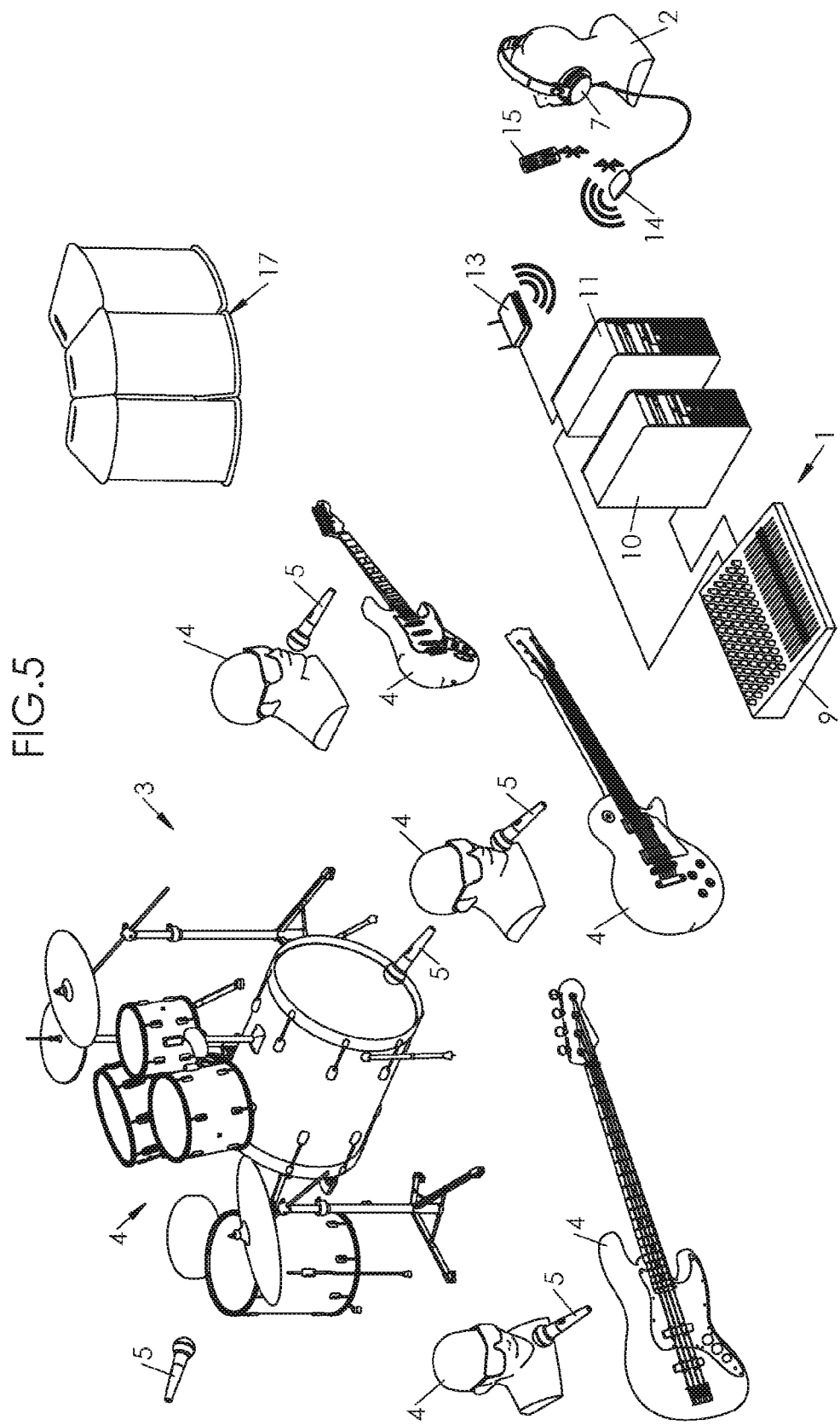
Figure 6:
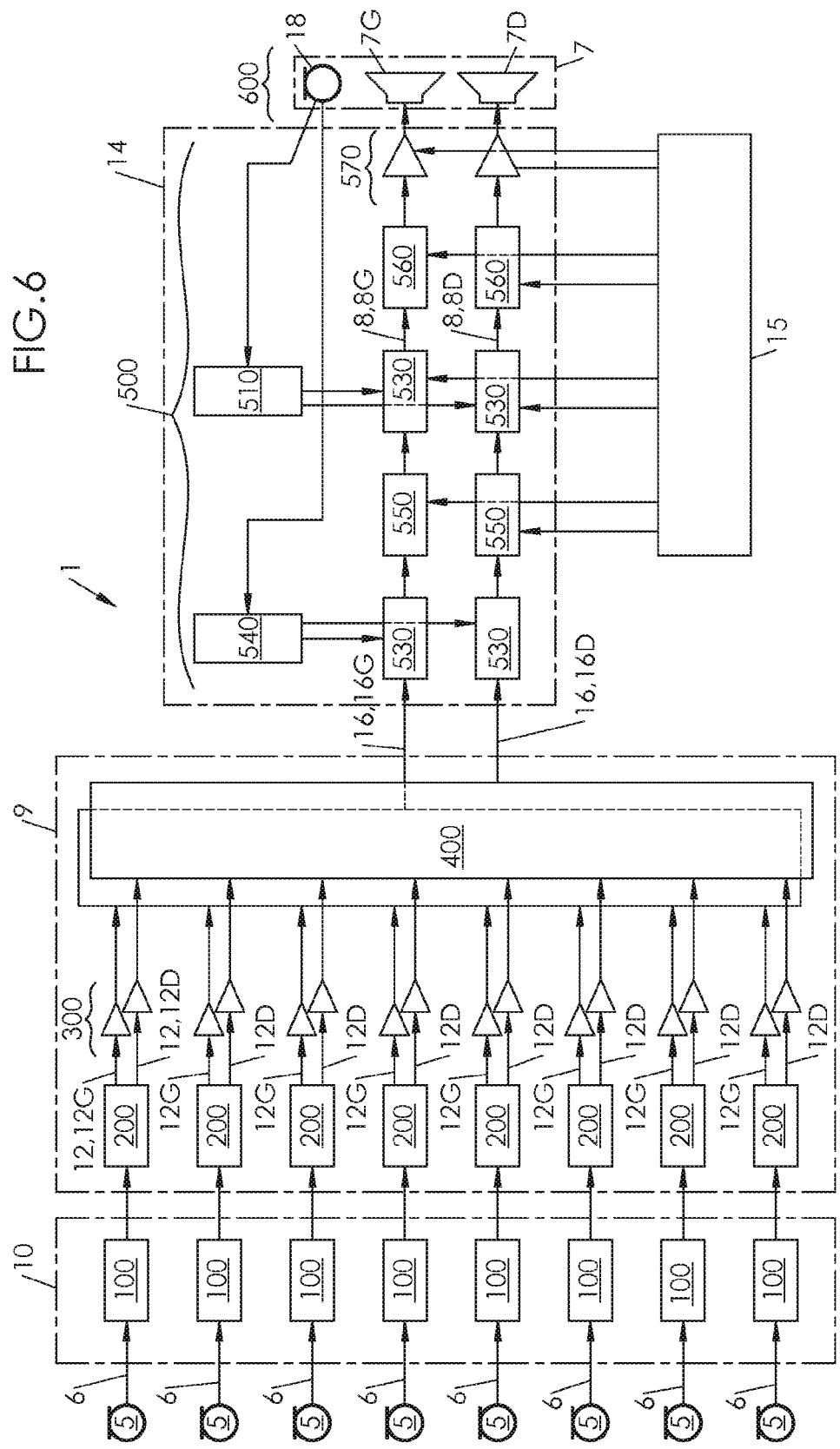
Figure 7:
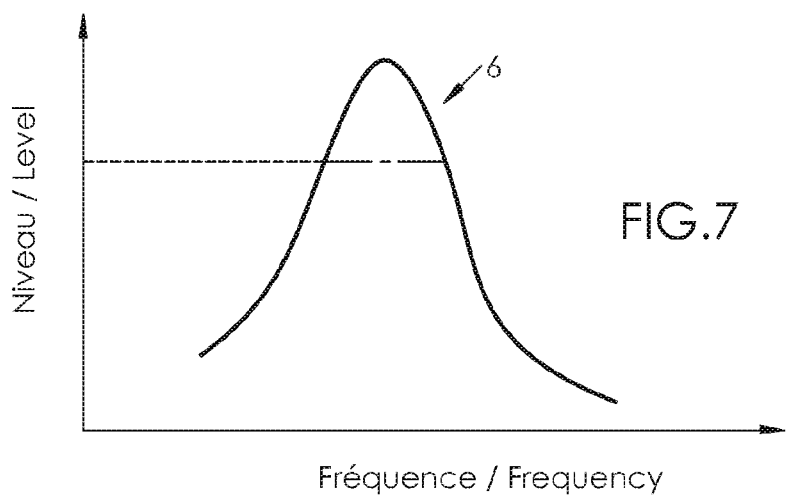
Figure 8:
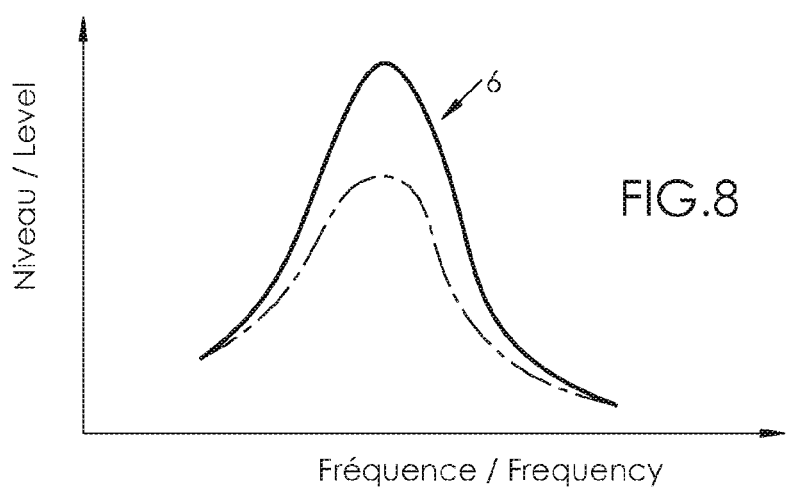
Figure 9:
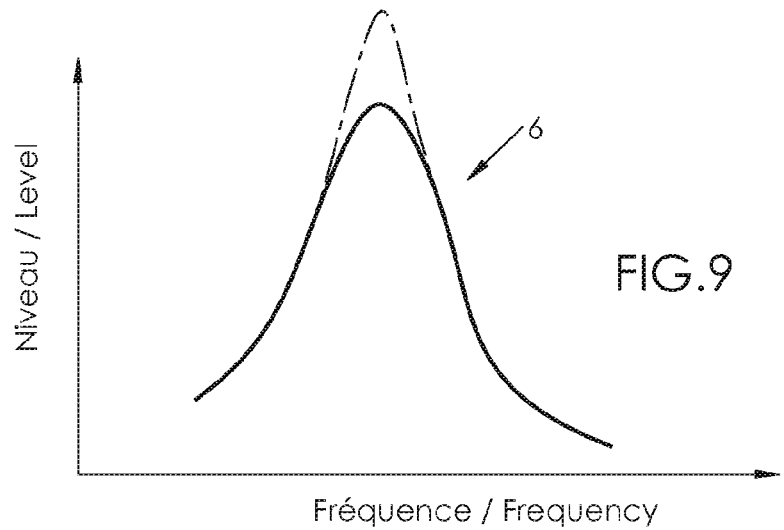

Other objects and advantages of the invention shall appear in the light of the description of an embodiment, given hereinafter in reference to the accompanying drawings wherein:

FIG. 1 is a level-frequency diagram showing the auditory field of a normal person (light gray), the auditory field of a person suffering from a particular hearing loss (limit as a dotted line), the musical field ("Music", medium gray), and the vocal field ("Voice", dark gray);

FIG. 2 is a level-frequency diagram showing the isosonic curves of a normal human being, i.e. who has perfect hearing;

FIG. 3 is a Loss-frequency diagram showing, as a solid line, the level of hearing loss (so to speak zero) of a normal human being, and as a mixed line the level of hearing loss of a person suffering from presbyacusis;

FIG. 4 is a level-frequency diagram showing the isosonic curves of a hard-of-hearing human, suffering from a particular hearing loss;

FIG. 5 is a diagram showing a stage on which a concert is given which is the object of a live public address indented for an audience of a public address system intended to procure for the hard of hearing present in the audience good listening comfort for the concert;

FIG. 6 is a diagram showing in part the functional architecture of the public address system, FIG. 7, FIG. 8 and FIG. 9 are level-frequency diagrams showing the same signal subjected to three different processings (the signal resulting from the treatment appears as a mixed line): cut-off (FIG. 7), compression (FIG. 8), gain (FIG. 9).

FIG. 5 shows a public address system 1 of a concert emitting sounds including music and, where applicable, voices, to the benefit of a public (or audience) comprising one or more listeners 2. This concert is "live" because the sounds emitted are restored directly (subject to the broadcast delay in real time or the time for the sound to travel in the air).

The location where the concert takes place is not necessarily closed; it can in particular be a room, an esplanade, a plateau, an arena, or a stadium. The location can be sheltered of be in the open air.

The concert is given by a band 3 composed of sound sources 4 comprising instruments (played by instrumentalists) and, where applicable, singing musicians.

The concert benefits from a sound pick up, the public address system 1 comprising for this purpose microphones 5 each pointing towards one or more sound sources 4 (instruments or groups of instruments, voice or groups of voices). Each microphone 5 thus picks up (or records) the sounds resulting from one or more sound sources 4 in the form of an electric signal that forms a raw audio channel 6. A microphone 5 can be fixed (by being mounted for example on a stand) or mobile, by being for example held or carried by a singing musician or integrated into a mobile instrument (for example in a bass guitar or in an electric guitar).

Each listener 2 wears (or is intended to wear) headphones 7 equipped with at least one speaker 7G, 7D (and advantageously a pair of speakers 7G, 7D dedicated respectively to the left ear and to the right ear of the listener 2).

The public address system 1 is designed for live broadcast, in the (or each) speaker 7G, 7D of the headphones 7, of a conditioned audio signal 8 from different raw audio channels 6.

For this purpose, the public address system 1 comprises in particular one or more consoles 9 (each one integrating at least mixing functions). The console 9 can be equipped with an integrated processor able to be programmed to apply signal processing to each channel 6.

In the example shown, the public address system 1 comprises one or more servers 10, 11 connected to the console 9, and including processors programmed to apply signal processing to each channel 6.

The console 9 is configured to collect in parallel several tracks 12 resulting from different channels 6, or the channels 6 themselves. The channels 6 are for example in the number of eight, but this number is not limiting.

According to an embodiment shown in FIG. 5, the public address system 1 comprises an application server 10, that integrates signal processing functions, and a communication server 11. The communication server 11 is connected to (and manages) one or more routers 13 configured to ensure a broadcast of signals via radio by means of one or more antennas, for example according to the standard IEEE 802.11 (Wi-Fi).

Each listener 2 is equipped with an apparatus 14 for receiving and for playing signals received from the console 9 or from the communication server 11 via at least one router 13. This apparatus 14 is directly or indirectly connected to the headphones 7, either with a wire (as shown), or via radio, for example according to the standard IEEE 802.15 (Bluetooth®).

According to an embodiment shown in the drawings, and more precisely in FIG. 5 and FIG. 6, the public address system 1 also comprises a mobile terminal 15 of the smartphone, tablet or portable computer type. The terminal 15 is configured (i.e. in practice it includes a programmed application) to dialogue with the apparatus 14.

The terminal 15 in particular comprises a processor, a primary wireless communications interface able to allow for dialogue with the apparatus 14, for example according to the standard IEEE 802.15 (Bluetooth®) and an graphics interface, for example a touch screen.

The processor of the terminal 15 can integrate an application (which can be remotely downloaded, for example from download platform or from the communication server 11), comprising instructions for making available to the listener 2, via the graphics interface, different settings that can be customised, for example a balance or an equalizer.

The processor of the terminal 15 is programmed to communicate these settings to the apparatus 14 so that it applies them to the signal (or to the signals) received from the console 9 or from the server 11 via the router 13, before restitution in the speaker or speakers 7G, 7D of the headphones 7.

The public address system 1 is connected to, or integrates, a database wherein characteristics of the auditory perception of the listener 2 are memorised. These characteristics of the auditory perception have for example the form of isosonic curves.

According to an embodiment, the characteristics of the auditory perception of the listener 2 comprise at least one of the following curves A curve representing the auditory perception threshold of the listener 2;

A curve representing the pain threshold of the listener 2;

A curve representing an acoustic comfort level of the listener 2.

Each isosonic curve can be constructed during a prior measuring phase, during which pre-recorded sound stimuli are broadcast in the headphones 7 of the listener 2 in order to arouse a response from him, chosen from among a list of multiple choices, that provide information on the level of the stimuli such as perceived by the listener 2.

This measurement phase can be conducted by an application implemented in the processor of the terminal 15, to which the headphones 7 are then connected.

The characteristics of the auditory perception, specific to each listener 2, can, in this case, be memorised in his terminal 15. Alternatively, the characteristics of the auditory perception of each listener 2 are memorised in a remote database, to which the console 9 or the communication server 11 can connect, for example via an identifier (optionally paired with a password) associated with the listener 2 concerned.

These characteristics of the auditory perception are used to apply to each channel 6 one (or more) corrections with the purpose of producing a conditioned audio signal 8 from different raw channels 6 and intended to be broadcast in the headphones 7 of the listener 2, with the purpose of procuring for the latter good listening comfort.

For this purpose, the public address system 1 is designed to apply three successive phases.

A first pre-processing phase 100 comprises

Taking into account the characteristics of the auditory perception of the listener 2;

An operation of correcting each channel 6 as a function of the characteristics of the auditory perception of the listener 2.

As shown in FIG. 6, each channel 6 transits for this purpose through the application server 10 (which can be integrated, in the form of a software module, into the console 9).

Each channel 6 has the form of an electric signal resulting from the pick up carried out by a microphone 5. The channel 6 consequently represents the audio spectrum of a particular sound source 4, which, as has been seen, can be formed from an instrument or a group of instruments (for example the violins in an orchestra symphonic) or of one or more voices (for example a singer or a choir).

The signal of each channel 6 can be represented by a curve that represents a voltage or an electrical power characteristic of a level of acoustic pressure (preferably on a logarithmic scale), according to the frequency (which can also be on a logarithmic scale).

FIG. 7, FIG. 8 and FIG. 9 show as a solid line, a curve extract (the scales are not provided) showing a local variation in the level on a channel 6.

Several types of correction can be applied to each channel 6:

A frequency correction,
A time correction,
A level correction.

Each one of these corrections can be applied alone or in combination with one or more other corrections.

Thus, the correction 100 applied to each channel 6 can comprise one or more processings chosen from:

A clipping (FIG. 7), which can be applied when the local level of the signal of the channel 6 exceeds a threshold that corresponds (optionally with a safety margin) to the pain threshold of the listener 2 or to his comfort level;

A compression (FIG. 8), which can be applied when the local slope of the signal of the channel 6 is too vertical, which indicates that the level is likely to quickly exceed the pain threshold of the listener 2 or his comfort level;

A gain (FIG. 9), which can be applied when the local level of the signal of the channel 6 is less than the hearing threshold or the comfort level of the listener 2.

In this pre-processing phase 100, applied independently to each channel 6, account is advantageously taken of the auditory level of comfort of the listener 2. If the level of comfort was not recorded beforehand (and stored in the database), it can be determined as needed (in particular in real time), for example via calculation from the pain threshold when the latter is available.

Indeed, it can be considered that the level of comfort of a listener 2 is equal to his pain threshold decreased by a given attenuation, for example by a value of 10 dB.

In the pre-processing phase 100, the correcting of each channel 6 can consist of bringing it substantially (at the very least locally) to the auditory level of comfort of the listener 2.

In practice, the pre-processing phase 100 comprises for example the operations that consist of:

Sampling each channel in frequency (by the means, typically, of an analogue-to-digital converter),
Selecting on the channel 6 one or more frequency ranges;
Applying to the channel 6 a processing in the selected frequency range or ranges, as a function of the characteristics of the auditory perception of the listener 2 in this frequency range or ranges.

This sequence makes it possible, firstly, to apply to each channel 6 a digital processing rather than an analogue processing. It makes it possible, secondly, to limit the corrections to the frequency ranges in which the raw signal (sampled) would not be broadcast as such to the listener 2 without adversely affecting his listening comfort (for example because the level is greater than his comfort level, or because it is less than his hearing threshold).

The pre-processing phase 100 is followed by a mixing phase 400 which comprises the production, from the channels 6 thus pre-processed, of a mixed audio signal 16.

According to an embodiment shown in FIG. 6, between the pre-processing phase 100 and the mixing phase 400, a panoramic processing operation 200 is provided in order to form, from each pre-processed channel 6, a left track 12G and a right track 12D. The panoramic processing 200 can be applied by the console 9 or by the application server 10.

In this case, the 400 mixing phase is advantageously conducted independently for the left tracks 12G and for the right tracks 12D resulting from the pre-processing of each channel 6, in such a way as to produce a left mixed audio signal 16G and a right mixed audio signal 16D at the output of the console 9.

As shown also in FIG. 6, between the panoramic processing 200 and the mixing phase 400, an operation 300 of amplifying the left tracks 12G and the right tracks 120 resulting from each channel 6 can furthermore be provided. This amplification 300 can be applied by the console 9 or by the application server 10.

As each channel 6 was corrected in order to take account, in specific portions of its spectrum, of the characteristics of the auditory perception of the listener 2, the mixed audio signal 16 (optionally with left-right separation) is, over the entire spectrum, adapted to this auditory perception. In particular, the mixed audio signal 16 can be adapted to the level of comfort of the listener 2.

However the concert is broadcast live. It consequently generates natural sounds that propagate in the open field. Furthermore, the concert can be the object (by means of a public address system 1 or a separate system) of a general public address intended for the audience. For this purpose, the sounds resulting from a sound pick up (for example by means of the same microphones 5 as those used for generating and processing the signal intended for the headphones 7) are broadcast by means of speakers 17.

Consequently, the listener 2 is exposed (through his headphones 7) to a background noise of which the acoustic pressure results from the propagation of natural sounds in the open field and from the broadcast resulting from the general public address via the speakers 17.

If the listener 2 is rather far from the stage, the acoustic pressure of the background noise can be comprised, for the most part, of the broadcast by speakers 17 (which can be scattered around the audience or among it, and which, furthermore, procure an amplification of the acoustic signal recomposed from sounds that have been picked up).

Consequently, the listener 2 perceives two acoustic signals:

A mixed signal resulting from the console 9 and broadcast in his headphones 7;
The background noise penetrating into his headphones 7.

It is thus understood that the sum of these two signals can adversely affect the listening comfort of the listener 2. In particular, it may be that the sum of the signals exerts on the listener 2 a sound pressure level greater than his comfort level, even his pain threshold.

The background noise that surrounds the listener 2 outside of his headphones 7 cannot be attenuated. However, the background noise that penetrates into the headphones 7 can be attenuated.

The attenuation can be procured at least in part by pads of the headphones 7 surrounding the ears of the listener 2, which are advantageously lined with a foam that has sound insulation properties.

The attenuation can furthermore be procured or improved by an active noise reduction system (ANR) with which the headphones 7 are advantageously equipped. This noise reduction system comprises a microphone 18, integrated into the headphones 7, which pick up the background noise, and control electronics (also integrated into the headphones 7) that analyse the noise thus picked up in order to estimate the level of it, and generates a counter-noise in opposition of phase of the background noise. The counter-noise is then broadcast in real time in the headphones 7, which attenuate the background noise in the latter.

However, even thus attenuated, the background noise can, by being added to the mixed signal resulting from the console 9, adversely affect the listening comfort of the listener 2.

That is why, after the mixing phase 400, a post-processing phase 500 is provided, which comprises:

An operation 510 of measuring the sound level of the background noise penetrating into the headphones 7;

An operation 520 of global correction of the mixed audio signal 16 as a function of the sound level of the background noise.

The post-processing phase 500 is carried out by the apparatus 14, to which the mixed audio signal 16 is communicated (and more precisely, in the example shown, the left and right mixed audio signals 16G, 16D).

More precisely, in this post-processing phase 500

The pain threshold for the listener 2 is taken into account or determined;

The mixed audio signal 16 is corrected in such a way that the global sound level in the headphones 7, comprising the mixed audio signal and the background noise penetrating into the headphones 7, are at any instant less than the pain threshold of the listener 2.

If the characteristics of the auditory perceptions memorised for the listener 2 include his pain threshold, the latter is simply taken into account. If the pain threshold has not been memorised, but the auditory comfort level has been memorised, the pain threshold can be determined through calculation from the level of comfort, for example by adding a predetermined gain (typically 10 dB).

It is observed that the mixed audio signal 16 (resulting from the console 9) and the background noise, which both result from the same sound source or sources 4, are not synchronous. Indeed, the mixed audio signal 16 reaches the listener 2 at the electronic speed (roughly close to the speed of light), while the background noise reaches the listener at the speed of sound, which is much less than the electronic speed.

Even when taking account the signal processing applied by the public address system 1, the mixed audio signal 16 is ahead of the background noise. It is therefore necessary to synchronise them so that the listener 2 does not have any echo during listening.

That is why the post-processing phase 500 preferably includes an operation 530 of delaying applied to the mixed audio signal 16. This operation is carried out by the apparatus 14, which is for this purpose equipped with a delay line (hardware or software). For this purpose, a correlation is made between the mixed audio signal 16 and the background noise, in order to estimate the delay between them (operation 540) and the mixed audio signal 16 is delayed in order to be adjusted on the background noise.

Note that the operation 530 of delaying precedes the operation 520 of global correction.

As an equalisation setting can be controlled by the listener, it is moreover advantageous to apply the operation 520 of global correction only after taking into account any equalisation setting 550.

In the example shown, where the console 9 produces a left mixed audio signal 16G and a right mixed audio signal 16D, the post-processing phase 500 is applied to each one of these signals 16G, 16D in order to produce a conditioned left audio signal 8G (resulting from post-processing) and a conditioned right audio signal 8D.

As shown in FIG. 6, the apparatus 14 is equipped for safety with a function 560 for the manual general setting of the level, reserved for the listener 2, which can be applied globally to the conditioned signal 8, optionally with a separation for the left conditioned signal 8G, and for the right conditioned signal 8D, and which determines the listening sound volume.

This post-processing phase 500 is followed (optionally after amplification 570, as shown in FIG. 6), by a phase 600 of restoring, in the headphones 7, the post-processed conditioned audio signal 8 (here left and right).

The public address method which has just been described consequently allows persons who suffer from hearing loss to retrieve listening comfort when listening to music broadcast live, not only despite their hearing loss but also taking account their characteristics of auditory perception.

As each listener 2 has his own characteristics of auditory perception, he benefits from customised listening. It can be seen that the impact of the background noise, which is taken into account, can be attenuated. Note however that it is not necessarily desirable to fully suppress the background noise, which can procure for a listener 2 who is used to isolation the sensation of this time being fully integrated into an audience.

The invention claimed is:

1. A public address method for live musical broadcast, in at least one speaker equipping a helmet headphones worn or intended to be worn by a listener and comprising a speaker, of an audio signal produced from a plurality of raw audio channels, the method comprising:

a pre-processing phase comprising:
taking into account characteristics of an auditory perception of the listener, who suffers from hearing loss, the auditory perception being based on one or more isosonic curves associated with said listener;
correcting each channel as a function of the characteristics of the auditory perception of the listener;

a mixing phase comprising production, from the pre-processed plurality of channels, of a mixed audio signal;

a post-processing phase comprising:
measuring a sound level of a background noise penetrating into the helmet headphones;
correcting the mixed audio signal as a function of the sound level of the background noise to produce the audio signal;

a phase of reproducing, in the helmet headphones, the audio signal resulting from the post-processing phase.

2. The method according to claim 1, wherein the correction applied to each channel comprises a frequency correction.

3. The method according to claim 1, wherein the correction applied to each channel comprises a time correction.

4. The method according to claim 1, wherein the correction applied to each channel comprises a level correction.

5. The method according to claim 1, wherein the correction applied to each channel comprises one or more processings chosen from a clipping, a compression, a gain.

6. The method according to claim 1, wherein the pre-processing phase comprises:
sampling each channel in frequency,
selecting on the channel one or more frequency ranges;

applying to the respective channel of the plurality of channels a processing in the selected frequency range or ranges, as a function of the characteristics of the auditory perception of the listener in said frequency range or ranges.

7. The method according to claim 1, wherein, in the pre-processing phase, taking into account characteristics of the auditory perception of the listener comprises taking into account or determining an auditory comfort level.

8. The method according to claim 7, wherein, in the pre-processing phase, the correcting of each channel comprises bringing each respective channel to the auditory comfort level of the listener.

9. The method according to claim 1, further comprising, between the pre-processing phase and the mixing phase, a panoramic processing operation in order to form, from each pre-processed channel, a left track and a right track.

10. The method according to claim 9, further comprising, between the panoramic processing and the mixing phase, an amplification operation of the left tracks and of the right tracks resulting from each channel.

11. The method according to claim 10, wherein the mixing phase is conducted independently for the left tracks and for the right tracks, in such a way as to produce a left mixed audio signal and a right mixed audio signal.

12. The method according to claim 11, wherein the post-processing phase is applied to the left mixed audio signal and to the right mixed audio signal in order to produce a left conditioned audio signal and a right conditioned audio signal.

13. The method according to claim 1, wherein, in the post-processing phase, the measurement of the sound level of the background noise penetrating into the headphones is carried out by means of a microphone integrated into the headphones.

14. The method according to claim 1, wherein, in the post-processing phase:
- a pain threshold for the listener is taken into account or determined;
- the mixed audio signal is corrected in such a way that a global sound level in the headphones, comprising the mixed audio signal and the background noise penetrating into the headphones, is at any instant less than the pain threshold of the listener.

15. The method according to claim 1, wherein the post-processing phase comprises the application of a delay to the mixed audio signal.

\* \* \* \* \*

UNITED STATES PATENT AND TRADEMARK OFFICE
CERTIFICATE OF CORRECTION

PATENT NO.       : 11,297,454 B2
APPLICATION NO.  : 16/764577
DATED            : April 5, 2022
INVENTOR(S)      : Laurent Said It is certified that error appears in the above-identified patent and that said Letters Patent is hereby corrected as shown below:

On the Title Page

In Item (54) and in the Specification, Column 1, Lines 1-4, Title should read:
METHOD FOR LIVE PUBLIC ADDRESS, IN HEADPHONES, TAKING INTO ACCOUNT THE AUDITORY PERCEPTION CHARACTERISTICS OF THE LISTENER In the Claims Claim 1 (specifically Column 10, Lines 31-32; Column 10, Line 48; Column 10, Line 52) should read:
1. A public address method for live musical broadcast, in headphones worn or intended to be worn by a listener and comprising a speaker, of an audio signal produced from a plurality of raw audio channels, the method comprising:
    a pre-processing phase comprising:
        ◦ taking into account characteristics of an auditory perception of the listener who suffers from hearing loss, the auditory perception being based on one or more isosonic curves associated with said listener;
        ◦ correcting each channel as a function of the characteristics of the auditory perception of the listener;
    a mixing phase comprising production, from the pre-processed plurality of channels, of a mixed audio signal;
    a post-processing phase comprising:
        ◦ measuring a sound level of a background noise penetrating into the headphones;
        ◦ correcting the mixed audio signal as a function of the sound level of the background noise to produce the audio signal;
    a phase of reproducing, in the headphones, the audio signal resulting from the post-processing phase.

Signed and Sealed this
Twenty-fourth Day of May, 2022

*Katherine Kelly Vidal*

Katherine Kelly Vidal
*Director of the United States Patent and Trademark Office*